US009077341B1

(12) United States Patent
Chang et al.

(10) Patent No.: US 9,077,341 B1
(45) Date of Patent: Jul. 7, 2015

(54) PROGRAMMABLE MATRIX FOR THE ALLOCATION OF COMMUNICATION RESOURCES

(71) Applicant: Altera Corporation, San Jose, CA (US)

(72) Inventors: Catherine Chingi Chang, San Jose, CA (US); Henry Y. Liu, Millbrae, CA (US); Ramanand Venkata, Fremont, CA (US)

(73) Assignee: Altera Corporation, San Jose, CA (US)

( * ) Notice: Subject to any disclaimer, the term of this patent is extended or adjusted under 35 U.S.C. 154(b) by 70 days.

(21) Appl. No.: 13/802,752

(22) Filed: Mar. 14, 2013

(51) Int. Cl.
*H03K 19/177* (2006.01)

(52) U.S. Cl.
CPC .................................. *H03K 19/17748* (2013.01)

(58) Field of Classification Search
None
See application file for complete search history.

(56) References Cited

U.S. PATENT DOCUMENTS

| | | | | |
|---|---|---|---|---|
| 3,971,891 A * | 7/1976 | Wolcott | ........................ | 370/268 |
| RE29,991 E * | 5/1979 | Wolcott | ........................ | 370/268 |
| 5,477,165 A * | 12/1995 | ElAyat et al. | .................... | 326/38 |
| 5,744,980 A * | 4/1998 | McGowan et al. | ............. | 326/40 |
| 6,242,947 B1 * | 6/2001 | Trimberger | ..................... | 326/41 |
| 6,466,050 B1 * | 10/2002 | Mohammed et al. | ........... | 326/38 |
| 6,838,904 B1 * | 1/2005 | Agrawal et al. | ................. | 326/41 |
| 6,864,710 B1 * | 3/2005 | Lacey et al. | ..................... | 326/39 |
| 7,050,513 B1 * | 5/2006 | Yakhnich | ...................... | 375/341 |
| 7,385,421 B2 * | 6/2008 | Kaptanoglu | .................... | 326/41 |
| 7,557,612 B2 * | 7/2009 | Kaptanoglu | .................... | 326/41 |
| 7,714,610 B2 * | 5/2010 | He | ................... | 326/41 |
| 2001/0052793 A1 * | 12/2001 | Nakaya | ........................... | 326/41 |
| 2008/0082751 A1 * | 4/2008 | Okin et al. | ..................... | 711/115 |
| 2009/0302887 A1 * | 12/2009 | Kwasniewski et al. | ......... | 326/38 |
| 2013/0293264 A1 * | 11/2013 | Gupta | ............................. | 326/45 |

* cited by examiner

*Primary Examiner* — Crystal L Hammond
(74) *Attorney, Agent, or Firm* — Guadalupe M. Gracia

(57) ABSTRACT

In an embodiment of the present invention, a programmable matrix is provided for flexibly allocating communication resources among functional circuit blocks. For example, in an embodiment of the present invention, a programmable matrix is provided that allocations communications channels such as transceiver channels among various PCIe hard IP blocks that may be contained within a programmable logic device (PLD).

22 Claims, 9 Drawing Sheets

US 9,077,341 B1

PROGRAMMABLE MATRIX FOR THE ALLOCATION OF COMMUNICATION RESOURCES

FIELD OF THE INVENTION

The present invention generally relates to the field of integrated circuits and digital communications. More particularly, the present invention relates to the configuration of communication channels in integrated circuits.

BACKGROUND OF THE INVENTION

Implementation of hard IP modules in integrated circuits provides various benefits. For example, in contrast to a PLD implementation, by implementing hard IP, a significant savings in terms of logic elements is achieved. This can translate to savings in silicon area and potentially to reduced power consumption. A further advantage is that by implementing tested and proven hard IP, a designer is assured of a robust functional block that may lead to shorter design times.

In implementing certain hard IP, traditional approaches have placed certain fixed design constraints. For example, so as to assure the integrity of the hard IP, certain design changes have been prohibited. When implementing certain hard IP that may interface with communications channels, traditional approaches may have required dedicated assignments of communications channels. For example, when implementing PCIe functionality through hard IP, a traditional approach has been to dedicate a fixed number of communication channels to each PCIe block. This approach may be disadvantageous because it can result in the under-utilization of communication channels where certain of the PCIe blocks, for example, do not use all of their dedicated channels. More particularly, where one block does not use all of its channels, these unused channels cannot be used by other blocks to provide improved functionality.

There exists a need in the art for the flexible assignment of communication channels among hard IP blocks. There is a further need to avoid the under utilization of available communication channels.

SUMMARY OF THE INVENTION

The embodiments presented below providing structures and techniques for a flexibly allocating communication resources among functional circuit blocks. For example, in one embodiment of the present invention, a programmable matrix is provided that allocates communications channels, such as transceiver channels, where the communications channels of one or more PCIe hard IP blocks may be contained within a programmable logic device (PLD).

Such an implementation is not intended to be limiting, only exemplary. Indeed, embodiments of the present invention can find wide application in the design of integrated circuits. For example, a programmable matrix according to an embodiment of the present invention can generally be used to allocate the use of other types of available resources (e.g., communication channels) among functional circuit blocks that may use them (e.g., hard IP blocks).

These and other embodiments can be more fully appreciated upon an understanding of the detailed description of the invention as disclosed below in conjunction with the attached figures.

BRIEF DESCRIPTION OF THE DRAWINGS

The following drawings will be used to more fully describe embodiments of the present invention.

DETAILED DESCRIPTION OF THE INVENTION

The following description is of certain preferred embodiments presently contemplated for carrying out this invention. This description is made for the purpose of illustrating the general principles of this invention and is not meant to limit the inventive concepts claimed herein.

Figure 1:
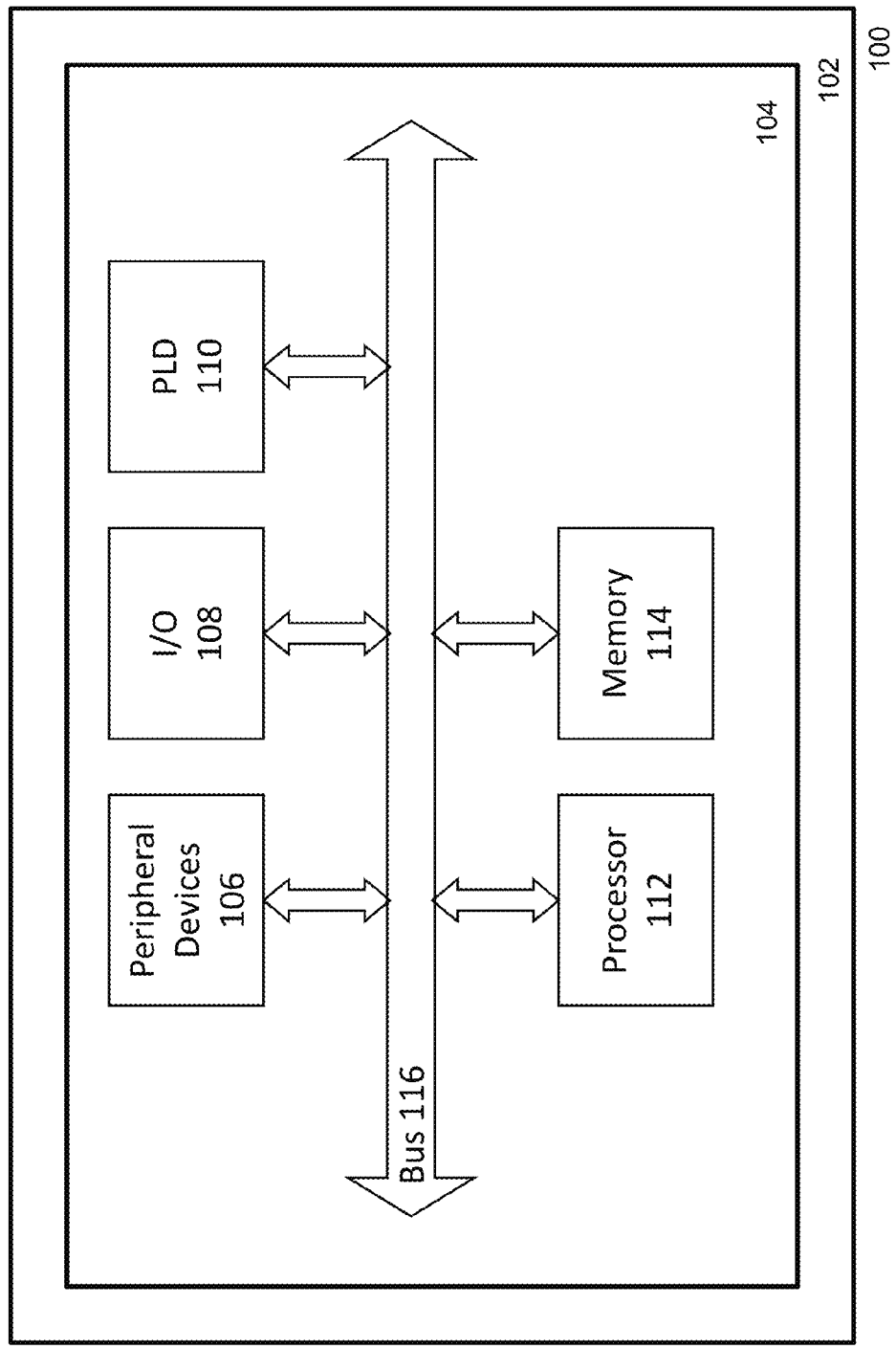
FIG. 1 is a block diagram of an data processing system employing a programmable logic device on which embodiments of the present invention can be implemented.

An embodiment of the present invention is intended for implementation in a programmable logic device (PLD), sometimes also called a Field Programmable Gate Array (FPGA), that can be implemented in a data processing system 100 such as shown in FIG. 1. Data processing system 100 may include one or more of the following components: processor 112; memory 114; I/O circuitry 108; and peripheral devices 106. These components are coupled together by system bus 116 and can be populated on a circuit board 104 which is contained in an end-user system 102.

System 100 can be used in a wide variety of applications, such as computer networking, data networking, instrumentation, video processing, digital signal processing, or any other application where the advantage of using programmable or reprogrammable logic is desirable. PLD 110 can be used to perform a variety of different logic functions. For example, PLD 110 can be configured as a processor or controller that works in cooperation with processor 112. PLD 110 may also be used as an arbiter for arbitrating access to a shared resource in system 100. In yet another example, PLD 110 can be configured as an interface between processor 112 and one of the other components in system 100. It should be noted that system 100 is only exemplary, and that the true scope and spirit of the invention should be indicated by the claims.

Various technologies can be used to implement PLDs 110 as described above and incorporating this invention. And although the invention has been described in the context of PLDs, it may be used with any programmable integrated circuit device.

With the advancement of PLDs, there has been an interest in including more and more dedicated functionality within the PLDs such as PLD 110. Among other things, processing and memory functionality has been implemented within PLDs so as to increase their applicability. In still other PLDs, high-end communication functionality is implemented including DSP blocks, high speed transceivers, and external memory interfaces. Indeed, in many PLDs implement specialized circuitry that is implemented in what is termed hard IP. Hard IP includes, for example, a low-level (e.g., transistor-level representations) representations of circuitry. An advantage of hard IP is that it offers predictable performance in terms of timing and silicon area. A disadvantage can be that its design it relatively fixed and cannot be manipulated without risking its stable performance.

The embodiments described herein find application in one or more types of circuit designs that include hard IP. As an example that is not intended to be limiting of the scope of the present invention, a particular hard IP block will be described with reference to its implementation in a PLD. After understanding the present disclosure, however, those of ordinary skill in the art will understand that the scope of the present invention is broader.

Figure 2:
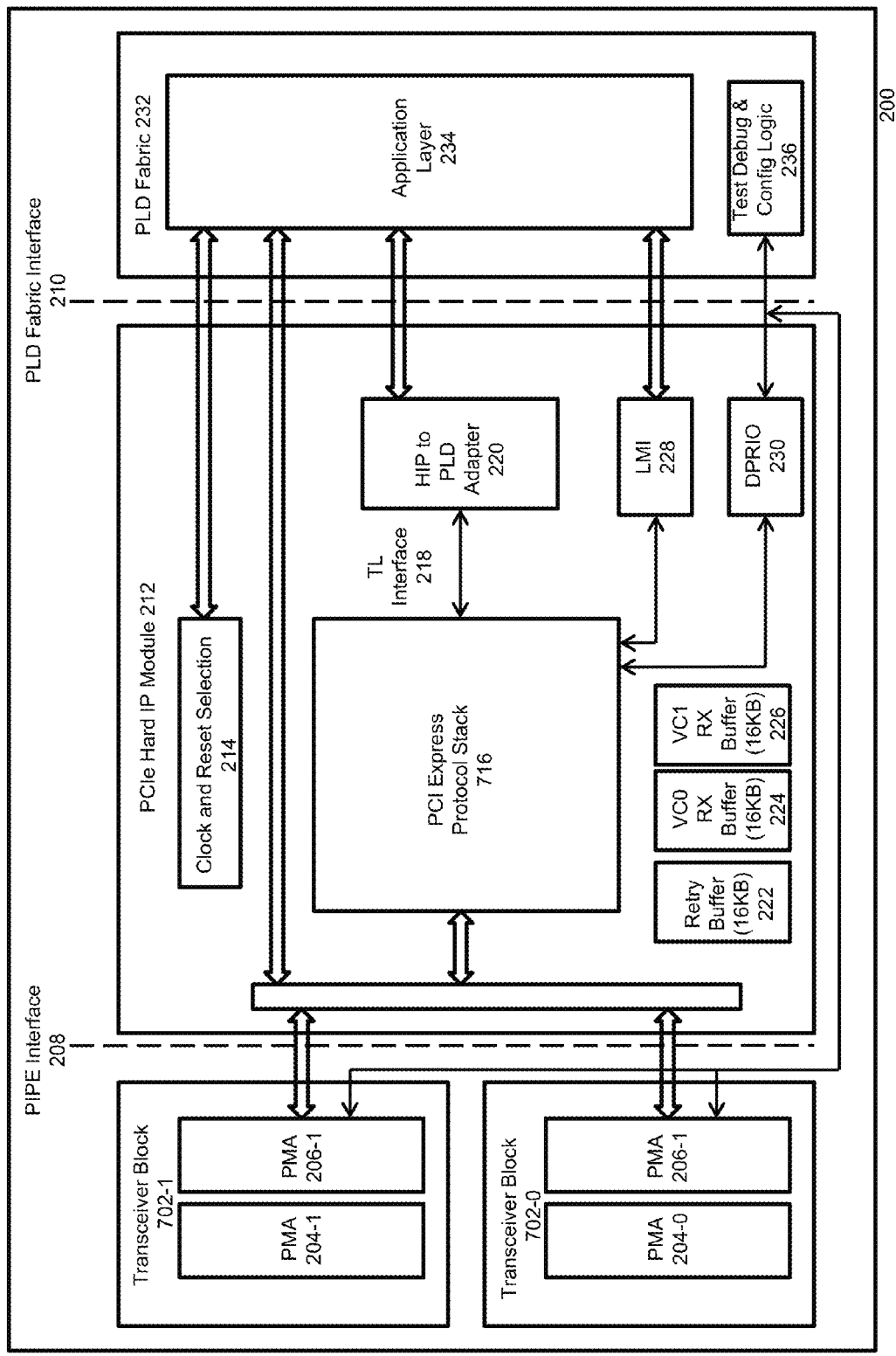
FIG. 2 is a block diagram of a PLD that includes a PCIe hard IP Module in accordance with an embodiment of the present invention.

Among other things, shown in FIG. 2 is a block diagram of an implementation of hard IP in PLD 200, in accordance with one embodiment. More particularly, FIG. 2 describes the manner in which PCIe Hard IP Module 212 is implemented in a PLD 200. PCIe, sometimes called PCI Express or Peripheral Component Interconnect Express, is a high-speed serial computer expansion bus standard designed to replace the older PCI, PCI-X, and AGP bus standards. PCIe has numerous improvements over the older bus standards, including higher maximum system bus throughput, lower I/O pin count and smaller physical footprint, better performance-scaling for bus devices, a more detailed error detection and reporting mechanism, and native hot-plug functionality. For example, PCIe operates in consumer, server, and industrial applications, as a motherboard-level interconnect to link motherboard-mounted peripherals, as a passive backplane interconnect, and as an expansion card interface for add-in boards. Even though the embodiments described herein make reference to PCIe, one of ordinary skill in the art will recognize that the present invention includes other applications that involve the allocation of communication channels to one or more functional circuit blocks on an integrated circuit. In particular embodiments, the allocated communication channels can be used to couple the one or more functional circuit blocks to other functional circuit blocks that are located on the same integrated circuit (e.g., on-chip) or on a different integrated circuit (e.g., off-chip).

As shown in FIG. 2, PCIe Hard IP module 212 embeds the PCI Express protocol stack 216 into PLD 200. PCIe Hard IP module 212 includes the transceiver blocks 202-0 and 202-1, physical layer, data link layer, and transaction layer. Hard IP module 212 can alternatively implement, for example, PCI Express Base Specification Rev. 3.0, 2.0, and 1.1. PCIe Hard IP module 212 further includes Local Management Interface 228 and Dynamic Partial Reconfigurable Input/Output 230 for interfacing with PLD Fabric 232 that includes, among other things, Application Layer 234 and Test Debug and Configuration Logic 236. Hard IP to PLD adapter 220 is provided for interfacing between PCIe Protocol Stack 216 of the PCIe Hard IP Module 212 and Application Layer 234 of PLD Fabric 232. PLD Fabric Interface 210 is provided for interfacing PCIe Hard IP Module 212 with PLD Fabric 232. Also, PIPE Interface 208 is provided for interfacing PCIe Hard IP Module 212 with Transceiver Blocks 202-0 and 202-1. In PLD 200, multiple copies of the PCIe hard IP module 212 may be available.

Implementation of PCIe Hard IP module 212 provides various benefits. For example, by implementing PCIe functionality in hard IP instead of within a PLD's programmable fabric, a significant savings in terms of logic elements is achieved. This further translates in savings in silicon area and potentially to reduced power consumption. Embedded memory such as buffers 222, 224, and 226 can allow for significantly faster memory operations. A further advantage is that by implementing tested and proven hard IP such as PCIe Hard IP module 212, a designer can use a robust functional thereby resulting in shorter design times.

In integrated circuits that implemented multiple PCIe hard IP, embodiments of the present invention provide for an improved manner of managing and utilizing the transceiver channels. For example, in embodiments of the present invention, utilization of the transceiver channels is not fixed or restricted. Instead, transceiver channels are mapped and grouped for higher utilization and improved groupings and implementations. Other embodiments of the present invention extend to other circuitry that implements multiple transceiver channels. Still other embodiment of the present invention can be used in serial or parallel transceiver implementations.

In a traditional approach, connections between a hardened PCIe IP, for example, and transceiver channels are implemented in a dedicated hard-wired mapping. In the discussion to follow, the PCIe IP will be described as operating in an xN mode (also called a bonding mode) where N is an integer that describes the number of data channels in use. In such an xN mode, one further channel is used as a clock channel. Therefore, PCIe IP operating in an x8 mode, for example, will need a total of nine (9) transceiver channels, eight for data and one for its clock.

Figure 3:
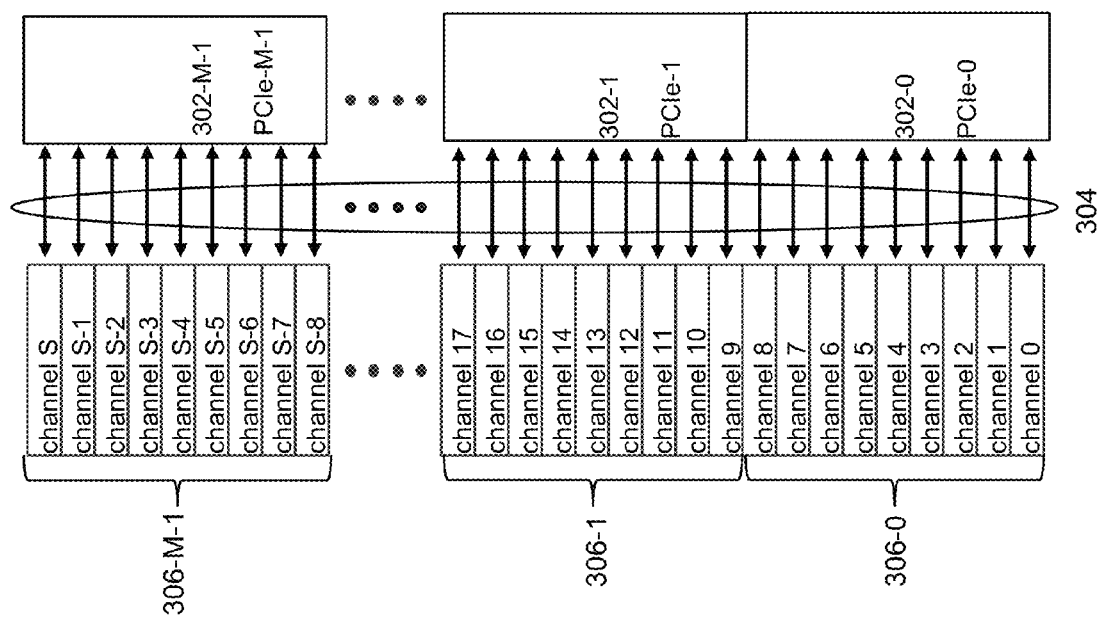
FIG. 3 is block diagram illustrating an approach for allocating communication channels among PCIe IP blocks.

The embodiments described herein can provide several advantages over a traditional approach to implementing PCIe IP blocks as shown in FIG. 3. Notable in such approaches is that there is a dedicated one-to-one mapping 304 between PCIe IP blocks and transceiver channels. For example, note that PCIe-0 302-0 through PCIe-M−1 302-M−1 are PCIe IP blocks implemented in hardened IP. Moreover, note that in the embodiment shown in FIG. 3, eight transceiver channels (i.e., channel blocks 306-0 through 306-M−1, respectively) are dedicated to each PCIe IP block. For example, channel block 306-0 includes channels 0 through 8 which are dedicated to PCIe-0 302-0; channel block 306-1 includes channels 9 through 17 which are dedicated to PCIe-1 302-1; and, more generally, channel block 306-M−1 includes channels S-8 through S which are dedicated to PCIe-M−1 302-M−1. In the implementation of FIG. 3, each of the PCIe IP blocks has nine dedicated transceiver channels. With this number of channels, each of the PCIe IP blocks can operate in a mode up to an x8 mode. Importantly, however, each node need not operate in an x8 mode.

Figure 4:
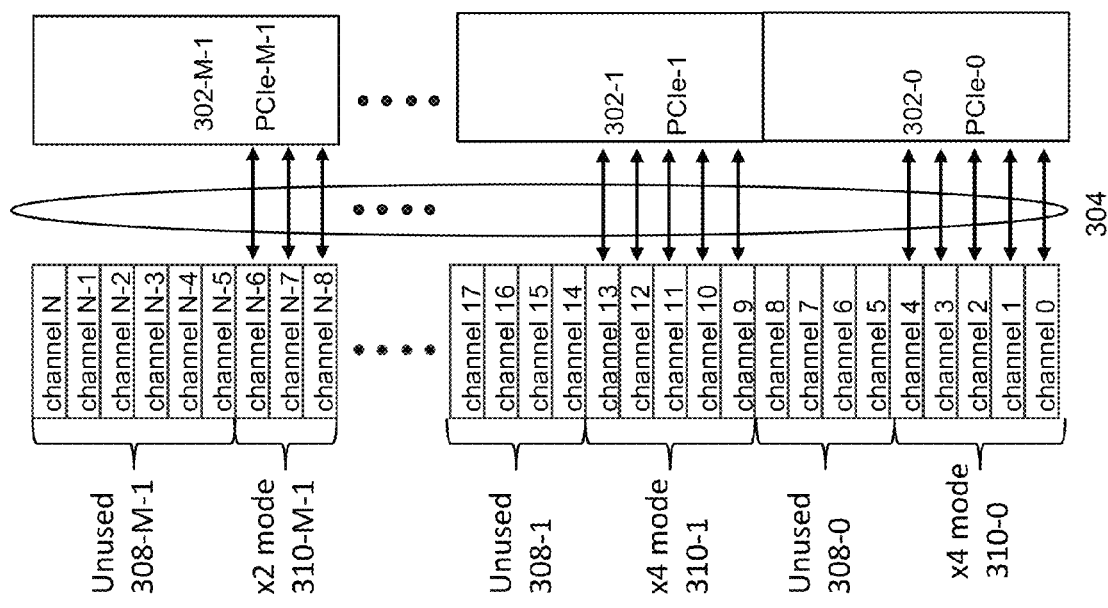
FIG. 4 is block diagram illustrating an approach for allocating communication channels among PCIe IP blocks.

Whereas the traditional approach as shown in FIG. 3 finds many useful applications, it also leads to under utilization of transceiver channels as illustrated in FIG. 4 when one or more of the PCIe IP blocks operate at less than maximum channel usage. For example, shown in FIG. 4 are various PCIe IP blocks (PCIe-0 302-0 through PCIe-M−1 302-M−1) operating in different modes. As shown, PCIe-0 302-0 is configured to operate in an x4 mode, which uses five channels (channels 0 through 4 310-0). But because a total of nine channels are dedicated to PCIe-0 302-0, a total of four channels are not utilized (channels 308-0). Importantly, in a traditional approach, such channels that are not used by PCIe-0 302-0 cannot be used by other PCIe IP blocks because of the fixed mapping 304. As shown, PCIe-0 302-1 is configured to operate in an x4 mode, which uses five channels (channels 9 through 13 310-1). But because a total of nine channels are dedicated to PCIe-1 302-1, a total of four channels are not utilized (channels 308-1). Importantly, in a traditional approach, such channels that are not used by PCIe-1 302-1 cannot be used by other PCIe IP blocks. Also as shown, PCIe-M-1 302-M-1 is configured to operate in an x2 mode, which uses three channels (channels N-8 through N 310-M-1). But because a total of nine channels are dedicated to PCIe-M-1 302-M-1, a total of 6 channels are not utilized (channels 308-M-1). Importantly, in a traditional approach, such channels that are not used by PCIe-M-1 302-M-1 cannot be used by other PCIe IP blocks.

Through the implementation of more and more PCIe IP blocks, it can be appreciated that there may be a significant amount of under utilization of the transceiver channels in a traditional approach that dedicates a fixed number of transceiver channels to each PCIe IP through fixed mapping 304.

Figure 5:
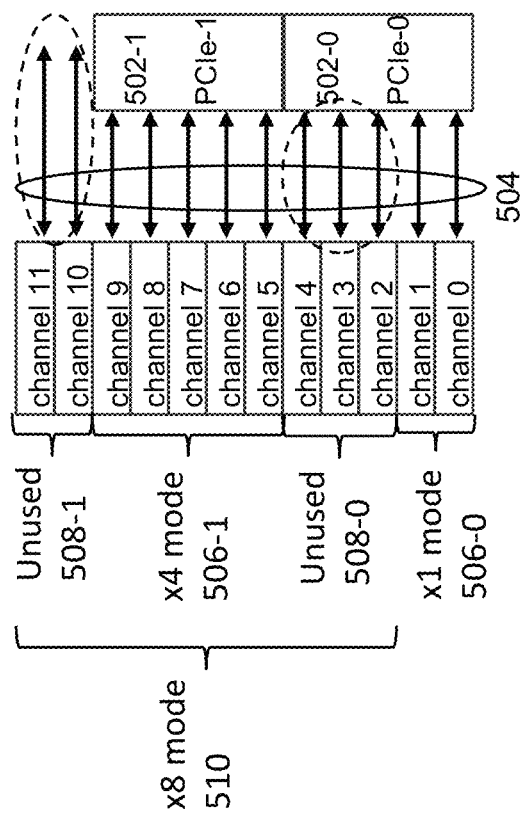
FIG. 5 is block diagram illustrating an approach for allocating communication channels among PCIe IP blocks.

A consequence of the dedicated mappings between PCIe IP and transceiver channels is that the maximum transceiver channel width cannot be expanded even when unused channels may exist. For example, shown in FIG. 5 is an implementation that has 12 channels (channels 0 through 12) available for use. Further shown are two PCIe IP blocks (PCIe-0 and PCIe-1) where five transceiver channels are dedicated to each block. In such an implementation, two channels (channels 10 and 11) cannot be utilized in a traditional approach because of the fixed mapping 504. Moreover, where PCIe-0 502-0 is implemented in x1 mode requiring only two channels (channels 0 and 1), three more channels are not utilized. In total for the example of FIG. 5, five channels are unused and cannot be used by, for example, PCIe-1 502-1. In an embodiment, it may be desirable to implement PCIe-1 502-1 in x8 mode requiring a total of nine channels. Indeed, nine channels are available (unused channels 2, 3, 10 and 11, as well as dedicated channels 5-9), but the traditional approach allows for only the use of the dedicated channels 5-9 by PCIe-1 502-1 and cannot used any of the unused channels.

Various embodiments described herein are directed to reducing the under utilization of transceiver channels by, among other things, implementing a programmable channel configuration matrix that can flexibly map transceiver channel assignments to PCIe blocks. For example, in one embodiment of the present invention, the programmable matrix can be programmed so as to group the utilization of transceiver channels and, thereby, reduce waste. The matrix can be programmed to share the collection of channels among the various PCIe IP blocks so as to support flexible bonding modes (e.g., xN modes) including wider bonding modes (e.g., larger N) when necessary. Such methods for flexibly mapping transceiver channel assignments to PCie blocks can be advantageously used to selectively provide enhanced performance in low cost implementations, where the total number of available communication channels are grouped into a number of narrow width clusters, each narrow width cluster being used to couple to a respective functional block. In such low cost implementations, if one or more of the communication channels within a first narrow width cluster are not used, the unused communication channels can be allocated to second cluster to effectively increase the number of communication channels in the second cluster, thereby selectively increasing the performance of the second cluster.

Figure 6:
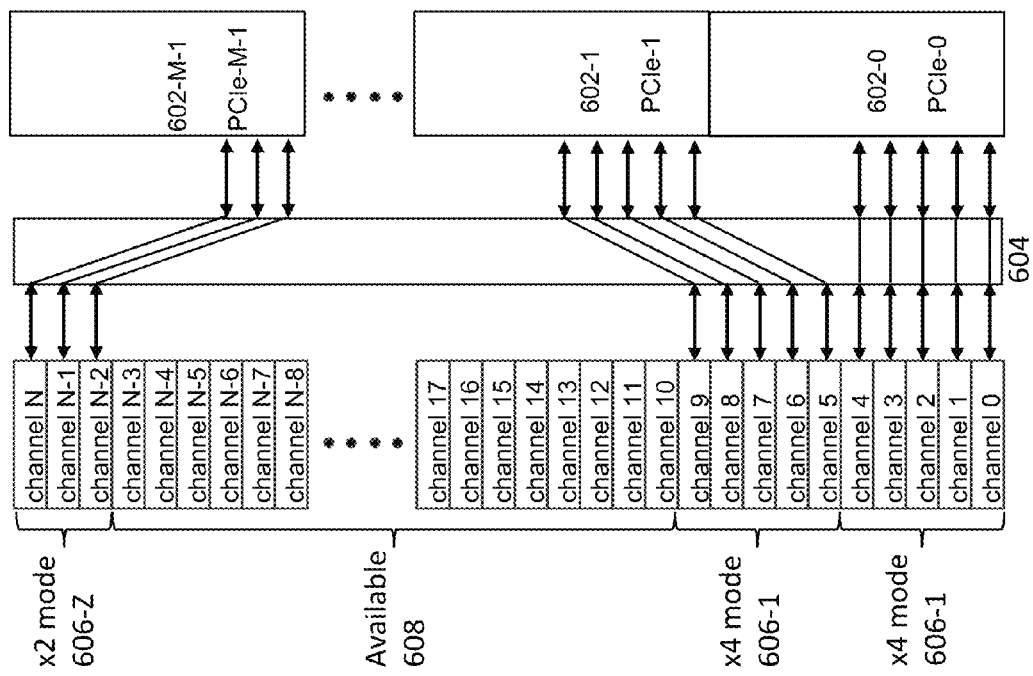
FIG. 6 is block diagram illustrating an embodiment for allocating communication channels among PCIe IP blocks.

FIG. 6 is a block diagram of an embodiment that implements programmable matrix 604 for assigning transceiver channels to PCIe blocks. As shown, a plurality of PCIe blocks are implemented (602-0 through 602-M-1). Instead of a dedicated mapping, however, programmable matrix 604 is implemented so as to flexibly map transceiver channels (channels 0 through N) to the PCIe blocks (602-0 through 602-M-1) as needed. For each of the needs of the various PCIe blocks, programmable matrix 604 can flexibly assign the necessary transceiver channels.

Whereas, the bonding modes of FIG. 4 (e.g., x4 and x2 modes) can be similar to the traditional approach of FIG. 4, the result of FIG. 6 is more efficient because of the functionality of programmable matrix 604. More particularly, where PCIe-0 602-0 is implemented in an x4 mode, programmable matrix 604 can assign five channels (e.g., channels 0-4) to PCIe-0 602-0. And where PCIe-0 602-1 is implemented in x4 mode, programmable matrix 604 can assign the next five available channels (e.g., channels 5-9) to PCIe-1 602-1. Embodiments using the programmable matrix 604 may avoid the waste of unused transceiver channels such as in the examples described with reference to FIG. 4, where a total of eight channels were not utilized in just the implementation of the first two PCIe blocks operating in x4 mode. In another embodiment, where a first allocation of channels is performed such as using the techniques described with reference to FIG. 4, the functionality of the programmable matrix according to an embodiment of the present invention is able identify unused communication channels and allocate them to IP blocks that can make use of them.

In an embodiment, programmable matrix 604 is able to assign the remaining available channels 608 to other PCIe IP blocks as appropriate for, preferably, maximum utilization. In a maximum-utilization situation, for example, the last PCIe-M-1 602-M-1 that is configured in an x2 mode uses the last three channels (channels N-2, N-1, and N) of all the available N transceiver channels. Even where less than maximal utilization is achieved, embodiments of the present invention, nonetheless, allow for increased utilization over the traditional approach.

Figure 7:
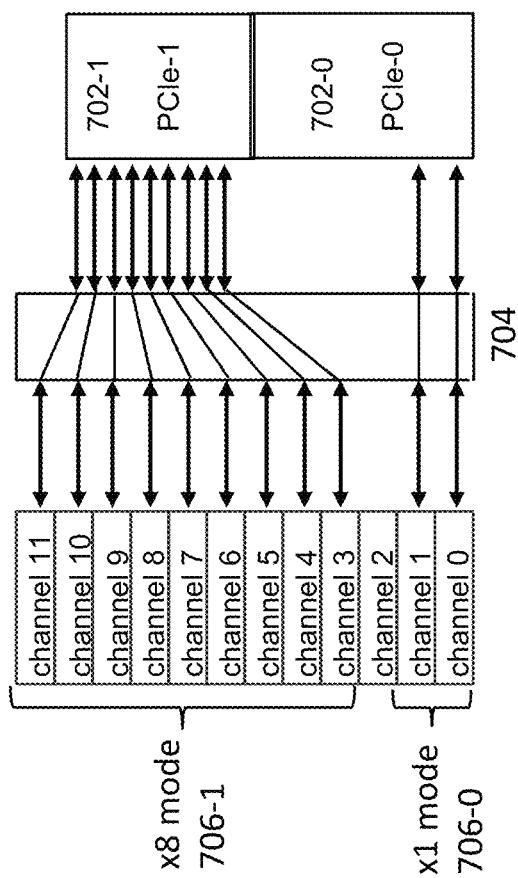
FIG. 7 is block diagram illustrating an approach according to an embodiment for allocating communication channels among PCIe IP blocks.

Shown in FIG. 7 is another embodiment of the present invention that provides for an improved implementation over the traditional approach as shown in FIG. 5. Recall that in the traditional approach of FIG. 5, the two PCIe blocks were limited to x4 mode while not utilizing a total of five transceiver channels. The embodiment of FIG. 7, however, with its implementation of programmable matrix 704 is able to make use of certain of the unused channels. More particularly, because PCIe-0 702-0 is configured in an x1 mode, only two channels are allocated to it by programmable matrix 704, leaving a total of ten other channels available for use by PCIe-1 702-1. With such an availability of channels it is possible, through the use of programmable matrix 704, to configure PCIe-1 702-1 in an x8 mode. As shown in FIG. 7, an implementation of the present invention allocates channels 3-11 to be coupled to PCIe-1 702-1. As a result, this embodiment of the present invention is able to more fully use the available channels and is further able to allow for implementations that were not possible according to the traditional approach.

Note that even through the use of programmable matrix 704 according to an embodiment of the present invention, there may be situations where unused channels, nonetheless, exist. Where there is a surplus of channels for the number of PCIe blocks that are to be implemented, embodiments of the present invention allow for increased design flexibility. For example, because of the flexibility of embodiments of the present invention, another implementation of the functionality of FIG. 7 could have allocated channels 2 through 10, instead of channels 3 through 11, to PCIe-1 702-1 so as to achieve an equivalently advantageous implementation as described above.

Because of the flexibility provided from certain embodiments of the present invention, a designer may be able to consider other characteristics of the various channels. For example, each of the channels may not have completely identical characteristics. Certain channels may be more physically proximate to circuitry of interest. Still other channels may have different operating characteristics (e.g., speed). Through the use of embodiments of the present invention, a designer can allocate channel resources to the various PCIe blocks as may be advantageous.

Embodiments of the present invention have been described with reference to PCIe IP blocks, but one of ordinary skill in the art will understand that the present invention has broader application. For example, other embodiments of the present invention can be generally implemented where functional blocks of circuitry are required to be coupled to predetermined communication channels. In such a situation, an embodiment of the present invention is able to flexibly allocate communication channels to the various functional blocks. Indeed, such functional blocks need not be homogenous (e.g., need not all be PCIe blocks) so long as they use a substantially similar communication channel.

A programmable matrix can be implemented in various ways so as to provide programmable functionality for coupling communication channels to circuitry blocks as may be desired. For example, in an embodiment of the present invention, programmable switching circuitry may be provided that flexibly couples communications channels to circuitry blocks. In an embodiment, a memory is provided for storing the configuration of the programmable matrix. For example, in an embodiment, non-volatile memory is provided so as to tolerate the loss of power to the circuitry. In still another embodiment, volatile memory can be implemented. Such an implementation may require a startup stage where the programmable matrix is configured upon power-up. In still another embodiment, fusible connections are provided for configuring the programmable matrix. In such an embodiment, the connections are made more permanent so as not to require subsequent programming.

In still another embodiment of the present invention, the interconnection fabric of a PLD can be used so as to provide the functionality of the programmable matrix of the present invention. For example, a typical PLD includes both programmable interconnect and programmable logic. The programmable interconnect typically includes a interconnect lines that are interconnected by programmable interconnect points. The programmable interconnect (as well as the programmable logic) can be programmed by loading a stream of configuration data into internal configuration memory cells that define the manner in which the programmable elements are configured. The configuration data can be read from memory (e.g., from an external non-volatile memory, such as flash memory or read-only memory) or written into the PLD by an external device. The collective states of the individual memory cells then determine the function of the FPGA. In this way the interconnections of the programmable matrix of the present invention can be defined.

Figure 8:
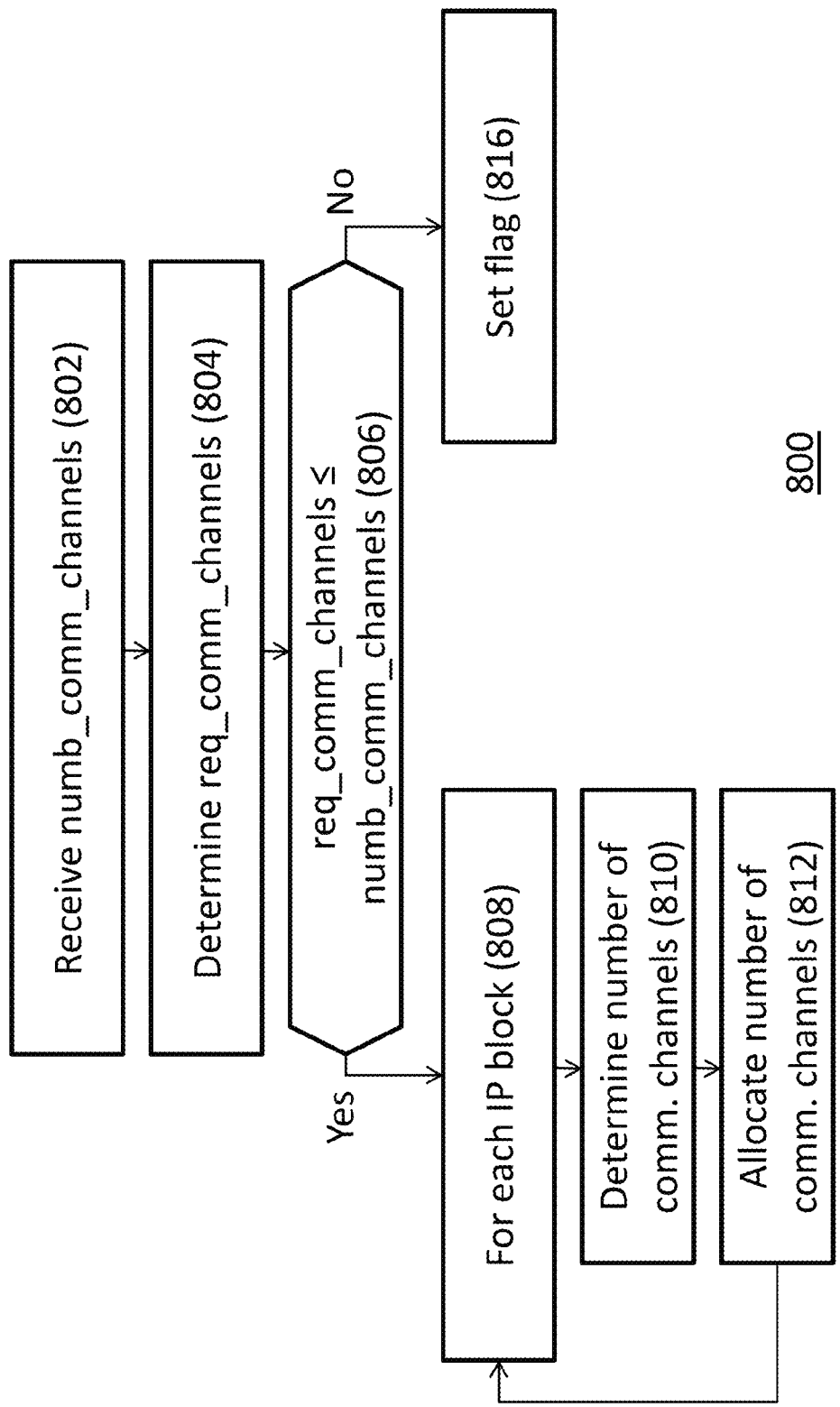
FIG. 8 is a flowchart for a method according to an embodiment for utilizing a programmable matrix to allocate communication channels.

An embodiment of the present invention for utilizing a programmable matrix for allocating communication channels is shown in flowchart 800 of FIG. 8. It should be noted that the described embodiments are illustrative and do not limit the present invention. It should further be noted that the method steps need not be implemented in the order described. Indeed, certain of the described steps do not depend from each other and can be interchanged. For example, as persons skilled in the art will understand, any system configured to implement the method steps, in any order, falls within the scope of the present invention.

As shown in FIG. 8, method 800 begins at step 802 by receiving input as to the number of available communication channels. At step 804, input is received as to the number of required communication channels for each IP block within an integrated circuit.

A first check is performed at step 806 to confirm that a sufficient number of communication channels are available for the various IP blocks. A condition is identified (e.g., set flag at step 814) where a sufficient number of communication channels are not available. Subsequent action may then be taken to address the issue. For example, it may be necessary to disable the functionality of at least one IP block. Alternatively, the functionality of at least one block may be reduced so as to reduce the required number of communication channels. Those of ordinary skill in the art will understand that many more possibilities are possible without deviating from the teachings of the present invention.

Where a sufficient number of channels are available to meet the needs of the various IP blocks, loop 808 (shown as a FOR loop) is performed for each IP block. In loop 808, an IP block is selected and its required number of communication channels is determined at step 810. At step 812, a programmable matrix is configured to allocate the required number of communication channels for the selected IP block. In an embodiment, the allocated communication channels are selected in an ordered manner. For example, the communication channels can be ordered according to characteristics related to their physical placement on an integrated circuit. At step 814, for example, an ordered allocation of communication channels could result in proximately located communication channels. Other manners of ordering communication channels are known to those of skill in the art and are applicable to embodiments of the present invention. In another embodiment of the present invention, however, communication channels are selected in a random manner.

Method 800 is completed when communication channels have been allocated to all the IP blocks. Importantly, method 800 does not allocate more communication channels to any IP block than such IP block is configured to use, thereby avoiding or reducing the number of unused communication channels.

Figure 9:
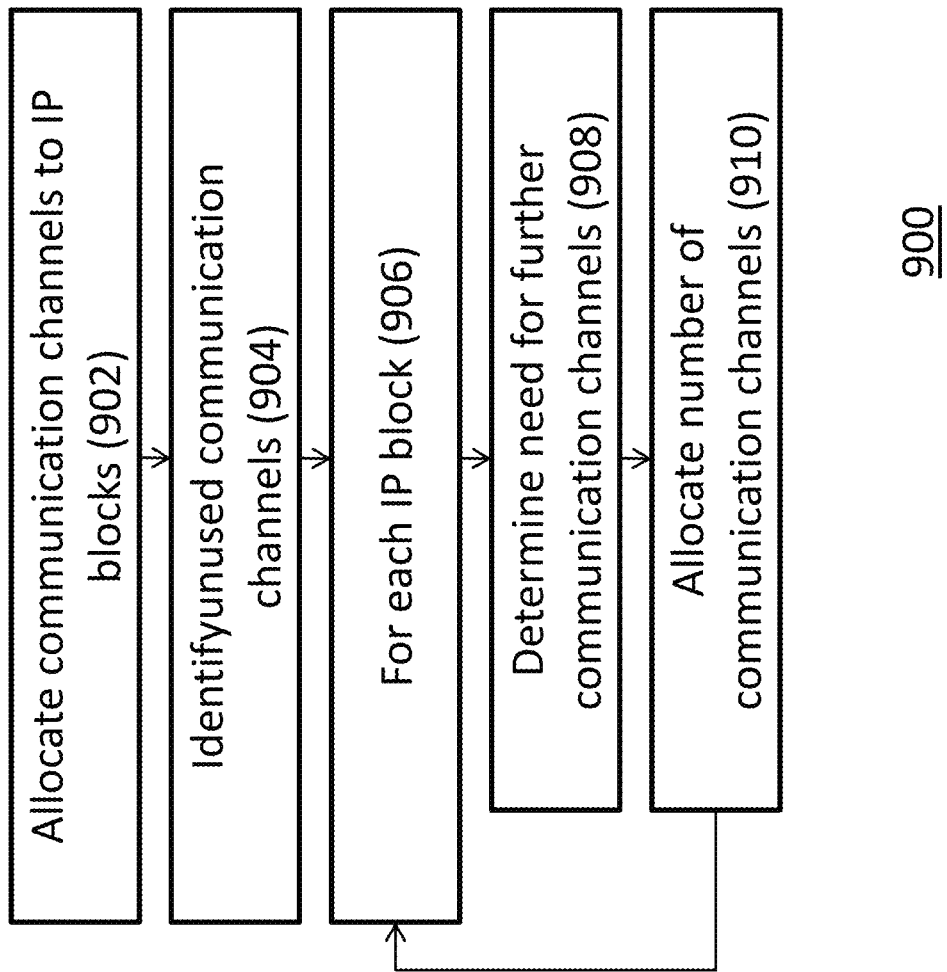
FIG. 9 is a flowchart for a method according to an embodiment for utilizing a programmable matrix to allocate communication channels.

Another embodiment of the present invention for utilizing a programmable matrix for allocating communication channels is shown in flowchart 900 of FIG. 9. It should be noted that the described embodiments are illustrative and do not limit the present invention. It should further be noted that the method steps need not be implemented in the order described. Indeed, certain of the described steps do not depend from each other and can be interchanged. For example, as persons skilled in the art will understand, any system configured to implement the method steps, in any order, falls within the scope of the present invention.

As shown in FIG. 9, method 900 begins at step 902 by allocating communication channels to IP blocks. For example, step 902 can be implemented using techniques such as described for FIGS. 4 and 5. Using such techniques, however, all the communication channels may not fully allocated for use by the IP blocks. The further steps of method 900, however, in conjunction with the use of a programmable matrix according to an embodiment of the present invention ensure more complete utilization of the available communication channels. At step 904, unused communication channels are identified. Because these channels are not in use, they are available to be allocated to other IP blocks that can make use of them.

Accordingly, at step where a number of channels are unused and available, loop 906 (shown as a FOR loop) is performed for each IP block. In loop 906, an IP block is selected and a determination is made at step 908 whether such IP block could make use of a number of further communication channels than were allocated a step 902. Where the selected IP block can make use of further communication channels, at step 910, a programmable matrix is configured to allocate the required number of communication channels for the selected IP block. In an embodiment, the allocated communication channels are selected in an ordered manner. For example, the communication channels can be ordered according to characteristics related to their physical placement on an integrated circuit. At step 910, for example, an ordered allocation of communication channels could result in proximately located communication channels. Other manners of ordering communication channels are known to those of skill in the art and are applicable to embodiments of the present invention. In another embodiment of the present invention, however, communication channels are selected in a random manner.

Method 900 is completed when all the unused communication channels have been allocated to all the IP blocks or when all of the IP blocks have been examined as part of loop 906.

In an embodiment, methods 800 and 900 are performed using digital processing resources residing within an integrated circuit that also includes the IP blocks and the communication channels. For example, methods 800 and 900 can be implemented by an on-die processor. In another embodiment, the methods is performed using digital processing resources residing outside of an integrated circuit that includes the IP blocks and the communication channels. For example, method 800 and 900 can be implemented by an off-die processor.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

It should be appreciated by those skilled in the art that the specific embodiments disclosed above may be readily utilized as a basis for modifying or designing other embodiments of the present invention. It should also be appreciated by those skilled in the art that such modifications do not depart from the scope of the invention as set forth in the appended claims.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed.

What is claimed is:

1. An integrated circuit, comprising:
    a first set of functional circuit blocks wherein each of the functional circuit blocks requires at least one transceiver communication channel;
    a first set of transceiver communication channels; and
    a programmable matrix configured to couple the first set of transceiver communication channels among the first set of functional circuit blocks.

2. The integrated circuit of claim 1, wherein the programmable matrix is configured to couple only a number of transceiver communication channels that is necessary for the operation of each functional circuit block within the first set of functional circuit blocks.

3. The integrated circuit of claim 1, wherein the first set of functional circuit blocks includes hard intellectual property circuit blocks.

4. The integrated circuit of claim 1, wherein the first set of functional circuit blocks includes a Peripheral Component Interconnect Express (PCIe) block.

5. The integrated circuit of claim 1, wherein the programmable matrix comprises logic switching circuitry.

6. The integrated circuit of claim 1, wherein the programmable matrix is implemented in a programmable logic device (PLD).

7. An integrated circuit configured as a programmable logic device, comprising:
    programmable logic;
    programmable interconnect;
    a first set of functional circuit blocks wherein each of the functional circuit blocks requires at least one transceiver communication channel;
    a first set of transceiver communication channels; and
    a programmable matrix configured to couple the first set of transceiver communication channels among the first set of functional circuit blocks.

8. The integrated circuit of claim 7, wherein the programmable matrix is configured to couple only a number of transceiver communication channels that is necessary for the operation of each functional circuit block within the first set of functional circuit blocks.

9. The integrated circuit of claim 7, wherein the first set of functional circuit blocks includes hard intellectual property circuit blocks.

10. The integrated circuit of claim 7, wherein the first set of functional circuit blocks includes a Peripheral Component Interconnect Express (PCIe) block.

11. The integrated circuit of claim 7, wherein the programmable matrix comprises logic switching circuitry.

12. The integrated circuit of claim 7, wherein at least a portion of the programmable matrix is implemented within the programmable logic.

13. A digitally-implemented method for allocating transceiver communication channels in an integrated circuit, the method comprising:
    receiving information regarding a total number of available transceiver communication channels in the integrated circuit;
    determining a total number of required transceiver communication channels for a plurality of first type of circuit blocks within the integrated circuit;
    for each first type of circuit blocks,
        determining a number of required transceiver communication channels;
        configuring a programmable matrix to allocate the required number of transceiver communication channels to the first type of circuit block.

14. The method of claim 13, determining whether the total number of required transceiver communication channels exceeds the total number of available transceiver communication channels.

15. The method of claim 14, further comprising setting an error flag.

16. The method of claim 13, wherein the required number of transceiver communication channels are allocated in an ordered manner.

17. The method of claim 13, wherein the required number of transceiver communication channels are allocated in a random manner.

18. The method of claim 13, further comprising, for each first type of circuit block, using the programmable matrix to couple the required number of transceiver communication channels to the first type of circuit block.

19. A digitally-implemented method for allocating transceiver communication channels in an integrated circuit, the method comprising:

allocating a number of available transceiver communication channels in the integrated circuit among a plurality of first type of circuit blocks within the integrated circuit;

determining a number of unused transceiver communication channels from among the allocated number of available transceiver communication channels;

for each first type of circuit blocks, determining whether the first type of circuit block can make use of a set of unused transceiver communication channels beyond those already allocated to the first type of circuit block;

configuring a programmable matrix to allocate the set of unused transceiver communication channels to the first type of circuit block.

20. The method of claim 19, wherein the required unused transceiver communication channels are allocated in an ordered manner.

21. The method of claim 19, wherein the unused transceiver communication channels are allocated in a random manner.

22. The method of claim 19, further comprising, for each first type of circuit block, using the programmable matrix to couple the set of unused transceiver communication channels to the first type of circuit block.

* * * * *